(12) United States Patent
Tomioka et al.

(10) Patent No.: US 9,059,699 B2
(45) Date of Patent: Jun. 16, 2015

(54) POWER SUPPLY SWITCHING CIRCUIT

(71) Applicant: Seiko Instruments Inc., Chiba-shi, Chiba (JP)

(72) Inventors: Tsutomu Tomioka, Chiba (JP); Atsushi Igarashi, Chiba (JP); Masakazu Sugiura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 148 days.

(21) Appl. No.: 14/029,221

(22) Filed: Sep. 17, 2013

(65) Prior Publication Data

US 2014/0084878 A1    Mar. 27, 2014

(30) Foreign Application Priority Data

Sep. 24, 2012  (JP) ................. 2012-209888

(51) Int. Cl.
   *G05F 3/26*    (2006.01)
   *G05F 1/59*    (2006.01)
   *G05F 1/56*    (2006.01)
   *G05F 1/46*    (2006.01)
   *H02J 3/14*    (2006.01)
   *H02J 1/10*    (2006.01)
   *H03K 17/00*   (2006.01)

(52) U.S. Cl.
   CPC ............. *H03K 17/005* (2013.01); *G05F 1/56* (2013.01); *H02J 1/10* (2013.01)

(58) Field of Classification Search
   CPC ............. G05F 3/26; G05F 3/262; G05F 1/59; G05F 1/56; G05F 1/465; H02J 3/14; H02J 9/062; H02J 1/10; H02J 3/158
   USPC ......... 323/263, 268, 269, 273, 311, 312, 313, 323/314, 315, 316, 317, 901
   See application file for complete search history.

(56) References Cited

U.S. PATENT DOCUMENTS

| 5,570,061 A    | 10/1996 | Shimoda |         |
|----------------|---------|---------|---------|
| 8,148,962 B2 * | 4/2012  | Elran   | 323/281 |
| 2010/0309715 A1* | 12/2010 | Choi   | 365/163 |
| 2012/0155127 A1* | 6/2012 | Brokaw | 363/49  |

FOREIGN PATENT DOCUMENTS

JP        06-244697 A        9/1994

* cited by examiner

*Primary Examiner* — Timothy J Dole
*Assistant Examiner* — Sisay G Tiku
(74) *Attorney, Agent, or Firm* — Brinks Gilson & Lione

(57) ABSTRACT

Provided is a power supply switching circuit capable of suppressing a load fluctuation such as undershoot that occurs at an output terminal at the time of power supply switching. The power supply switching circuit includes: a battery connected to the output terminal; a replica current generation circuit for generating a replica current that is proportional to a current flowing from the battery to the output terminal; a voltage regulator connected to the output terminal, the voltage regulator including a reference voltage circuit, an error amplifier circuit, an output transistor, and a voltage divider circuit; and a current mirror circuit for causing the replica current to flow through the output transistor of the voltage regulator.

4 Claims, 9 Drawing Sheets

POWER SUPPLY SWITCHING CIRCUIT

RELATED APPLICATIONS

This application claims priority under 35 U.S.C. §119 to Japanese Patent Application No. 2012-209888 filed on Sep. 24, 2012, the entire content of which is hereby incorporated by reference.

BACKGROUND OF THE INVENTION

1. Field of the Invention

The present invention relates to a power supply switching circuit for switching an output voltage between a voltage of a voltage regulator and a voltage of a battery.

2. Description of the Related Art

FIG. 9 is a circuit diagram illustrating a conventional power supply switching circuit.

The conventional power supply switching circuit includes a voltage detection circuit 903, an error amplifier circuit 904, a reference voltage circuit 908, resistors 906 and 907, PMOS transistors 901, 902, and 905, diodes 909 and 910, input terminals 911 and 912, an output terminal 913, and a ground terminal 100.

A voltage input to the input terminal 911 is represented by V1, and a voltage input to the input terminal 912 is represented by V2. When the voltage V1 increases to exceed a set voltage of the voltage detection circuit 903, an output of the output terminal 913 becomes a high voltage level. As a result, the PMOS transistor 905 is turned OFF, and the PMOS transistor 901, the resistors 906 and 907, the error amplifier circuit 904, and the PMOS transistor 902 operate as a voltage regulator so that a stabilized constant voltage is output from the output terminal 913.

A voltage appearing in a positive power source of the error amplifier circuit 904 is supplied from a connection point between the diodes 909 and 910, and is therefore a higher one of the voltage V1 and the voltage V2 regardless of a switch operation. Thus, the error amplifier circuit 904 operates stably regardless of the switch operation and a load fluctuation. On the other hand, when the voltage V1 of the input terminal 911 drops to invert the output of the output terminal of the voltage detection circuit 903 to a low voltage level, the PMOS transistor 905 is turned ON. The PMOS transistor 901 is turned OFF because the PMOS transistor 902 is turned ON to change a gate of the PMOS transistor 901 to the high voltage level. Consequently, the voltage V2 of the input terminal 912 is output to the output terminal 913 (see, for example, Japanese Patent Application Laid-open No. Hei 06-244697).

However, the conventional power supply switching circuit has the following problem.

When the voltage of the input terminal 911 (voltage V1) is low and when the PMOS transistor 901 of the voltage regulator is turned OFF, there is no channel in the PMOS transistor 901. In other words, immediately after the PMOS transistor 902 is turned OFF, the PMOS transistor 901 cannot supply a load current. Thus, if the power source is switched to the voltage regulator in the state where a load is connected to the output terminal 913, a voltage fluctuation such as undershoot occurs at the output terminal 913.

SUMMARY OF THE INVENTION

The present invention has been made in view of the above-mentioned problem, and provides a power supply switching circuit capable of suppressing a voltage fluctuation such as undershoot that occurs at an output terminal at the time of power supply switching.

In order to solve the conventional problem, a power supply switching circuit according to one embodiment of the present invention has the following configuration.

The power supply switching circuit includes: a replica current generation circuit for generating a replica current that is proportional to a current flowing from a first power supply terminal to an output terminal; a voltage regulator that operates with a voltage of a second power supply terminal, the voltage regulator including a reference voltage circuit, an error amplifier circuit, an output transistor, and a voltage divider circuit; and a current mirror circuit for causing the replica current to flow through the output transistor of the voltage regulator.

The power supply switching circuit according to the present invention can suppress a voltage fluctuation such as undershoot that occurs at the output terminal at the time of power supply switching.

DETAILED DESCRIPTION OF THE PREFERRED EMBODIMENTS

Embodiments of the present invention are described below with reference to the accompanying drawings.

In a power supply switching circuit, for example, a voltage of a USB cable is input to a first power supply terminal 101, and a battery is connected to a second power supply terminal 126. Alternatively, for example, a main large-capacity battery is connected to the first power supply terminal 101, and an auxiliary battery is connected to the second power supply terminal 126. In other words, the first power supply terminal 101 is connected to such a power source that has a relatively high voltage or a high capacity but is usually disconnected or may be disconnected. Then, the voltage of the power source is output to an output terminal via a voltage regulator. The second power supply terminal 126 is connected to a power source all the time. When the power source is connected to the first power supply terminal 101, the power supply switching circuit switches an output voltage from the voltage of the power source of the second power supply terminal 126 to the voltage of the voltage regulator.

First Embodiment

Figure 1:
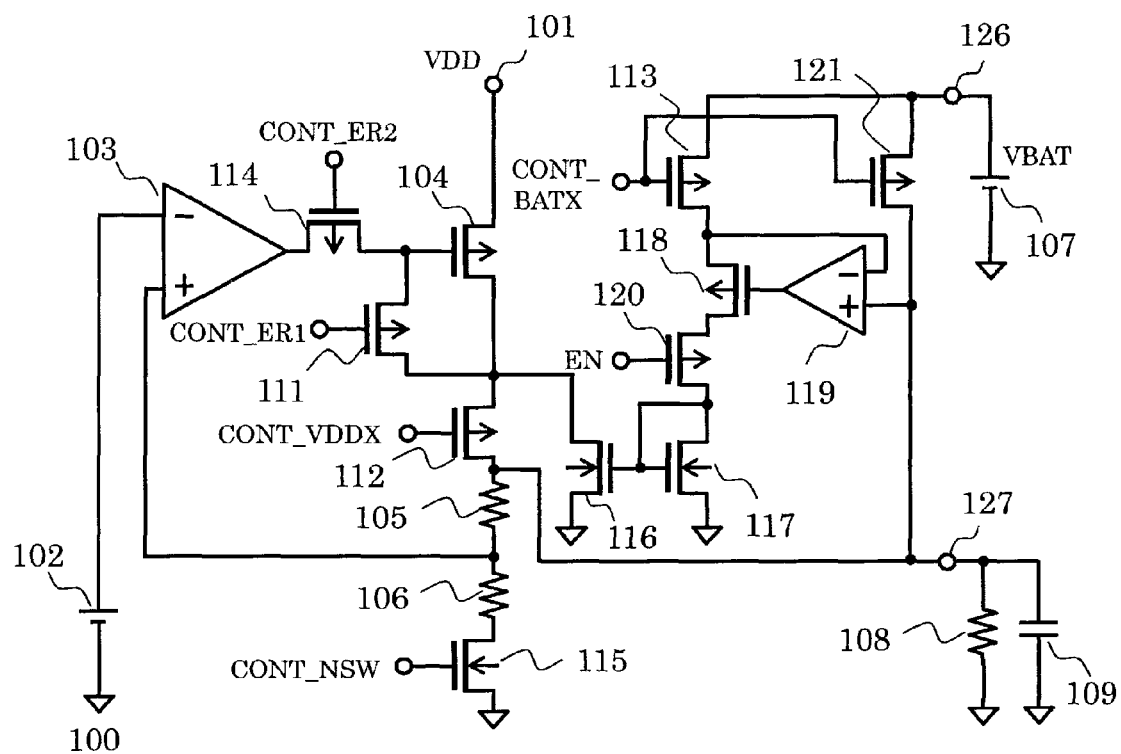
FIG. 1 is a circuit diagram illustrating a power supply switching circuit according to a first embodiment of the present invention.

FIG. 1 is a circuit diagram of a power supply switching circuit according to a first embodiment of the present invention.

The power supply switching circuit according to the first embodiment includes an error amplifier circuit 103, an amplifier 119, a reference voltage circuit 102, PMOS transistors 104, 111, 112, 113, 114, 118, 120, and 121, NMOS transistors 115, 116, and 117, resistors 105 and 106, a ground terminal 100, an output terminal 127, a first power supply terminal 101, terminals CONT_ER2, CONT_ER1, CONT_VDDX, CONT_NSW, CONT_BATX, and EN, and a second power supply terminal 126. In this embodiment, a description is given assuming that a battery 107 is connected to the second power supply terminal 126 while a load resistor 108 and a load capacitor 109 are connected to the output terminal 127.

Figure 2:
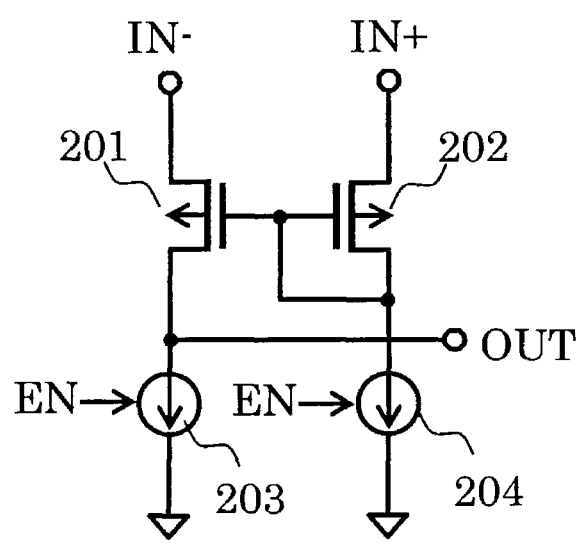
FIG. 2 is a circuit diagram illustrating a first example of an amplifier used in the first embodiment.

FIG. 2 is a circuit diagram illustrating a circuit configuration of the amplifier 119. The amplifier 119 includes PMOS transistors 201 and 202, bias circuits 203 and 204, an inverting input terminal IN−, a non-inverting input terminal IN+, and an output terminal OUT.

The error amplifier circuit 103, the reference voltage circuit 102, the PMOS transistor 104, and the resistors 105 and 106 form a voltage regulator. The amplifier 119 and the PMOS transistors 113, 121, and 118 form a replica current generation circuit.

Next, a description is given of connections in the power supply switching circuit according to the first embodiment. The error amplifier circuit 103 has an inverting input terminal connected to one terminal of the reference voltage circuit 102, a non-inverting input terminal connected to a connection point between one terminal of the resistor 105 and one terminal of the resistor 106, and an output terminal connected to a source of the PMOS transistor 114. The other terminal of the reference voltage circuit 102 is connected to the ground terminal 100. The PMOS transistor 114 has a gate connected to the terminal CONT_ER2, and a drain connected to a source of the PMOS transistor 111 and a gate of the PMOS transistor 104. The PMOS transistor 104 has a source connected to the first power supply terminal 101, and a drain connected to a drain of the PMOS transistor 111, a source of the PMOS transistor 112, and a drain of the NMOS transistor 116. The PMOS transistor 111 has a gate connected to the terminal CONT_ER1. The PMOS transistor 112 has a gate connected to the terminal CONT_VDDX, and a drain connected to the other terminal of the resistor 105 and the output terminal 127. The NMOS transistor 115 has a gate connected to the terminal CONT_NSW, a source connected to the ground terminal 100, and a drain connected to the other terminal of the resistor 106. The amplifier 119 has a non-inverting input terminal connected to the output terminal 127 and a drain of the PMOS transistor 121, an inverting input terminal connected to a source of the PMOS transistor 118 and a drain of the PMOS transistor 113, and an output terminal connected to a gate of the PMOS transistor 118. The PMOS transistor 113 has a gate connected to the terminal CONT_BATX, and a source connected to the second power supply terminal 126. The PMOS transistor 121 has a gate connected to the terminal CONT_BATX, and a source connected to the second power supply terminal 126. The PMOS transistor 120 has a gate connected to the terminal EN, a source connected to a drain of the PMOS transistor 118, and a drain connected to a drain and a gate of the NMOS transistor 117. The NMOS transistor 117 has a source connected to the ground terminal 100. The NMOS transistor 116 has a gate connected to the gate of the NMOS transistor 117, and a source connected to the ground terminal 100. The battery 107 has a positive terminal connected to the second power supply terminal 126 and a negative terminal connected to the ground terminal 100. The load resistor 108 has one terminal connected to the output terminal 127 and the other terminal connected to the ground terminal 100. The load capacitor 109 has one terminal connected to the output terminal 127 and the other terminal connected to the ground terminal 100.

A description is given of connections in the amplifier 119 illustrated in FIG. 2. The PMOS transistor 201 has a gate connected to a gate and a drain of the PMOS transistor 202, a drain connected to the output terminal OUT and one terminal of the bias circuit 203, and a source connected to the inverting input terminal IN−. The other terminal of the bias circuit 203 is connected to the ground terminal 100. The PMOS transistor 202 has a drain connected to one terminal of the bias circuit 204 and a source connected to the non-inverting input terminal IN+. The other terminal of the bias circuit 204 is connected to the ground terminal 100.

Figure 4:
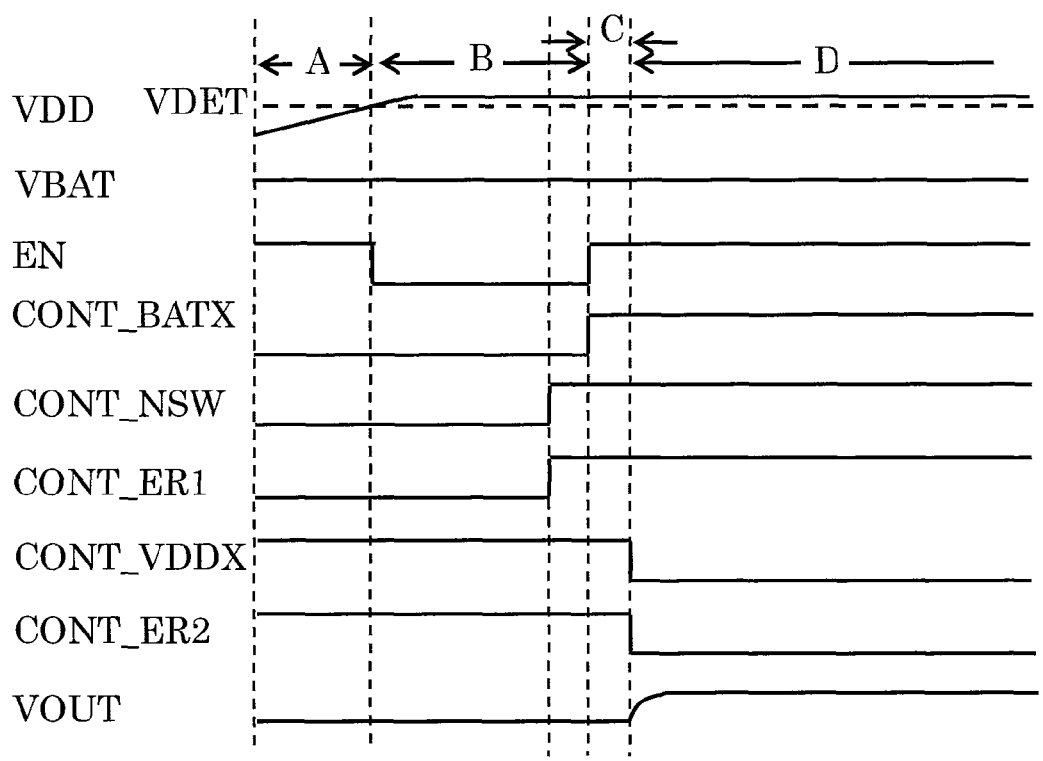
FIG. 4 is a timing chart according to the first embodiment.

Next, a description is given of the operation of the power supply switching circuit according to the first embodiment. FIG. 4 is a timing chart of the power supply switching circuit according to the first embodiment.

In a period A, the power source is connected to the first power supply terminal 101, and a voltage VDD rises. A voltage signal of Low is input to the terminal CONT_BATX. The PMOS transistors 113 and 121 are turned ON but operate in a resistance region. Thus, a voltage VOUT of the output terminal 127 becomes a voltage decreased from a voltage VBAT of the battery 107 by a voltage drop corresponding to a load current and an ON-state resistance of the PMOS transistor 121.

In a period B, when the voltage VDD rises to exceed a voltage VDET, a voltage signal of Low is input to the terminal EN, and hence the PMOS transistor 120 and the bias circuits 203 and 204 are turned ON to operate the amplifier 119. The PMOS transistor 121 operates in the resistance region, and hence the drain of the PMOS transistor 121 exhibits a voltage drop corresponding to the amount of the current from the battery 107. The PMOS transistor 113 has the same configuration having the same or smaller size than that of the PMOS transistor 121, and operates in the resistance region similarly to the PMOS transistor 121. The amplifier 119 controls the PMOS transistor 118 so that the voltage of the non-inverting input terminal and the voltage of the inverting input terminal may be equal to each other, and causes a current proportional to the size of the PMOS transistor 121 to flow through the PMOS transistor 113. The current flowing through the PMOS transistor 113 is referred to as "replica current", which is a current proportional to the current supplied by the battery 107 to the load resistor 108 via the output terminal 127. The NMOS transistor 117 and the NMOS transistor 116 form a current mirror circuit. Because a voltage signal of Low is input to the terminal CONT_ER1 and the PMOS transistor 111 is turned ON, the gate and the drain of the PMOS transistor 104 are diode-connected. In this state, the replica current is caused to flow through the PMOS transistor 104 via the current mirror circuit, and hence a voltage for causing the replica current to flow is held in the gate capacitor.

Next, after the lapse of the period during which the replica current flows through the PMOS transistor 104 and the voltage for causing the replica current to flow is held in the gate capacitor, a voltage signal of High is input to the terminal CONT_NSW and the terminal CONT_ER1, and hence the PMOS transistor 111 is turned OFF and the NMOS transistor 115 is turned ON. In this way, a voltage obtained by dividing the voltage of the output terminal 127 by the resistors 105 and 106 is input to the non-inverting input terminal of the error amplifier circuit 103. Although the PMOS transistor 111 is turned OFF, the replica current continues to flow through the PMOS transistor 104 for a while due to the voltage held in the gate capacitor of the PMOS transistor 104.

In a period C, a voltage signal of High is input to the terminal EN and the terminal CONT_BATX, and hence the PMOS transistors 113, 121, and 120 and the amplifier 119 are turned OFF. In this way, the supply of the current from the battery 107 to the output terminal 127 is interrupted. Further, the flow of the replica current to the NMOS transistor 117 is also interrupted.

In a period D, a voltage signal of Low is input to the terminal CONT_VDDX and the terminal CONT_ER2, and hence the PMOS transistor 114 and the PMOS transistor 112 are turned ON. In this way, the voltage regulator is activated so that the output voltage of the voltage regulator is output to the output terminal 127. Because the PMOS transistor 121 serving as the current path to the battery 107 has been turned OFF in the period B, the back flow of the output voltage of the voltage regulator to the battery 107 can be prevented. Further, because the voltage of the output terminal 127 is held by the load capacitor 109 for a while, the drop of the output voltage can be prevented by reducing the length of the period C.

Because the voltage for causing the replica current to flow is held in the gate capacitor of the PMOS transistor 104, such an operation as to abruptly fluctuate a load current at the output of the voltage regulator can be stopped. Further, if the output voltage of the voltage regulator is larger than the battery voltage VBAT, the voltage of the inverting input terminal of the error amplifier circuit 103 is larger than the voltage of the non-inverting input terminal in the period C, and hence the occurrence of undershoot can be suppressed at the time of switching.

Figure 3:
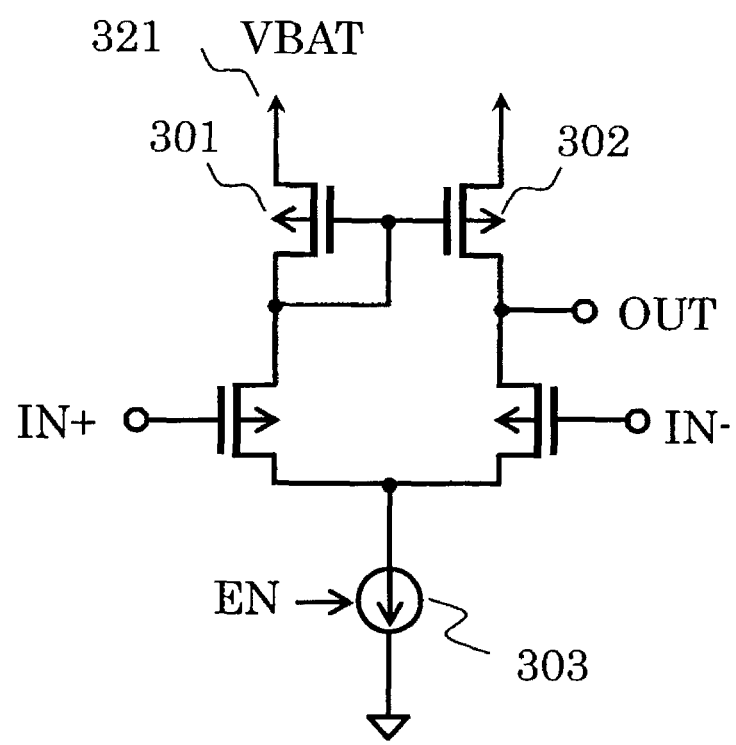
FIG. 3 is a circuit diagram illustrating a second example of the amplifier used in the first embodiment.

Note that, the amplifier 119 described above is the amplifier having the configuration illustrated in FIG. 2, but any other configuration such as a general amplifier as illustrated in FIG. 3 may be used as long as a bias current can be turned on and off by the signal of the terminal EN.

As described above, in the power supply switching circuit according to the first embodiment, by causing the replica current to flow through the PMOS transistor 104 in advance before the voltage of the output terminal 127 is switched, the gate voltage for causing the replica current to flow is held at the gate of the PMOS transistor 104. Then, such an operation as to fluctuate a load current at the output of the voltage regulator can be stopped at the time of switching the output voltage, and hence the occurrence of undershoot at the output terminal 127 can be prevented.

Second Embodiment

Figure 5:
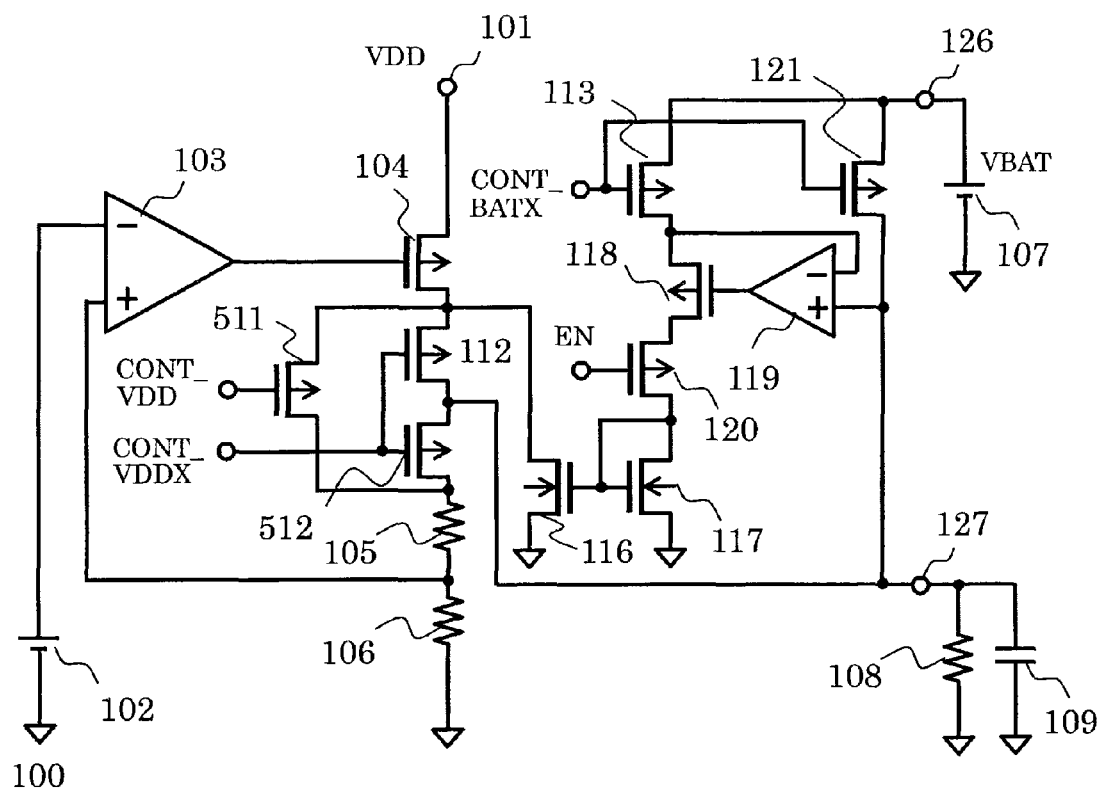
FIG. 5 is a circuit diagram illustrating a power supply switching circuit according to a second embodiment of the present invention.

FIG. 5 is a circuit diagram of a power supply switching circuit according to a second embodiment of the present invention. The difference from FIG. 1 resides in that the PMOS transistors 111, 114, and 115 and the terminals CONT_NSW, CONT_ER1, and CONT_ER2 are deleted and PMOS transistors 511 and 512 and a terminal CONT_VDD are added.

Next, a description is given of connections in the power supply switching circuit according to the second embodiment. The PMOS transistor 511 has a gate connected to the terminal CONT_VDD, a drain connected to a connection point between a drain of the PMOS transistor 512 and the resistor 105, and a source connected to a connection point between the drain of the PMOS transistor 104 and the source of the PMOS transistor 112. The PMOS transistor 512 has a gate connected to the terminal CONT_VDDX and a source connected to the output terminal 127. The resistor 106 has one terminal connected to the resistor 105 and the other terminal connected to the ground terminal 100. The PMOS transistor 104 has a gate connected to the output of the error amplifier circuit 103. The other connections are the same as those in the power supply switching circuit according to the first embodiment of FIG. 1.

Figure 6:
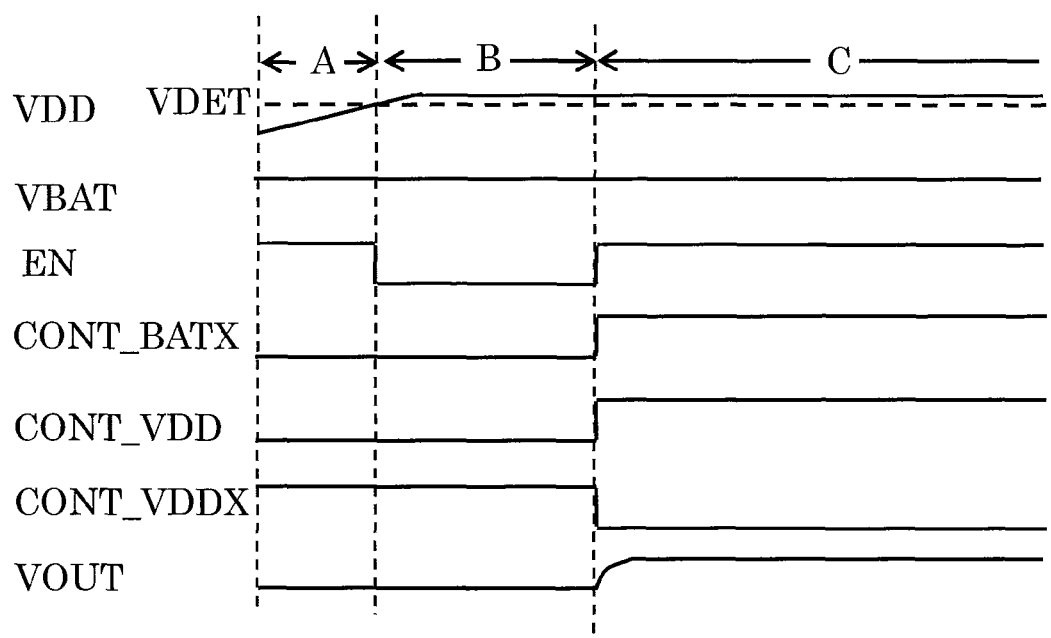
FIG. 6 is a timing chart according to the second embodiment.

Next, a description is given of the operation of the power supply switching circuit according to the second embodiment. FIG. 6 is a timing chart of the power supply switching circuit according to the second embodiment.

In a period A, the power source is connected to the first power supply terminal 101, and a voltage VDD rises. A voltage signal of Low is input to the terminal CONT_BATX. The PMOS transistors 113 and 121 are turned ON but operate in a resistance region. Thus, a voltage VOUT of the output terminal 127 becomes a voltage decreased from a voltage VBAT of the battery 107 by a voltage drop corresponding to a load current and an ON-state resistance of the PMOS transistor 121.

Because a voltage signal of Low is input to the terminal CONT_VDD, the PMOS transistor 511 is turned ON to activate the voltage regulator formed by the error amplifier circuit 103, the reference voltage circuit 102, the PMOS transistor 104, and the resistors 105 and 106.

In a period B, when the voltage VDD rises to exceed a voltage VDET, a voltage signal of Low is input to the terminal EN, and hence the PMOS transistor 120 and the bias circuits 203 and 204 are turned ON to operate the amplifier 119. The PMOS transistor 121 operates in the resistance region, and hence the drain of the PMOS transistor 121 exhibits a voltage drop corresponding to the amount of the current from the battery 107. The PMOS transistor 113 has the same configuration having the same or smaller size than that of the PMOS transistor 121, and operates in the resistance region similarly to the PMOS transistor 121. The amplifier 119 controls the PMOS transistor 118 so that the voltage of the non-inverting input terminal and the voltage of the inverting input terminal may be equal to each other, and causes a current proportional to the size of the PMOS transistor 121 to flow through the PMOS transistor 113. The current flowing through the PMOS transistor 113 is referred to as "replica current", which is a current proportional to the current supplied by the battery 107 to the load resistor 108 via the output terminal 127. The NMOS transistor 117 and the NMOS transistor 116 form a current mirror circuit to mirror the replica current flowing through the PMOS transistor 113 and thereby cause the replica current to flow through the PMOS transistor 104.

In a period C, a voltage signal of High is input to the terminal EN, the terminal CONT_BATX, and the terminal CONT_VDD, and a voltage signal of Low is input to the terminal CONT_VDDX. Then, the PMOS transistors 113, 121, 120, and 511 and the amplifier 119 are turned OFF, and the PMOS transistors 112 and 512 are turned ON. In this way, the supply of the current from the battery 107 to the output terminal 127 is interrupted. Further, the flow of the replica current to the PMOS transistor 104 is also interrupted, and hence the output of the voltage regulator is supplied to the output terminal 127. Because the voltage for causing the replica current to flow is held at the gate of the PMOS transistor 104, such an operation as to abruptly fluctuate a load current at the output of the voltage regulator can be stopped. Further, if the output voltage of the voltage regulator is larger than the battery voltage VBAT, the voltage of the inverting input terminal of the error amplifier circuit 103 is larger than the voltage of the non-inverting input terminal in the period C, and hence the occurrence of undershoot can be suppressed at the time of switching.

Note that, the amplifier 119 described above is the amplifier having the configuration illustrated in FIG. 2, but any other configuration such as a general amplifier as illustrated in FIG. 3 may be used as long as a bias current can be turned on and off by the signal of the terminal EN.

As described above, in the power supply switching circuit according to the second embodiment, by causing the replica current to flow through the PMOS transistor 104 in advance before the voltage of the output terminal 127 is switched, the gate voltage for causing the replica current to flow is held at the gate of the PMOS transistor 104. Then, such an operation as to fluctuate a load current at the output of the voltage regulator can be stopped at the time of switching the output voltage, and hence the occurrence of undershoot at the output terminal 127 can be prevented.

Third Embodiment

Figure 7:
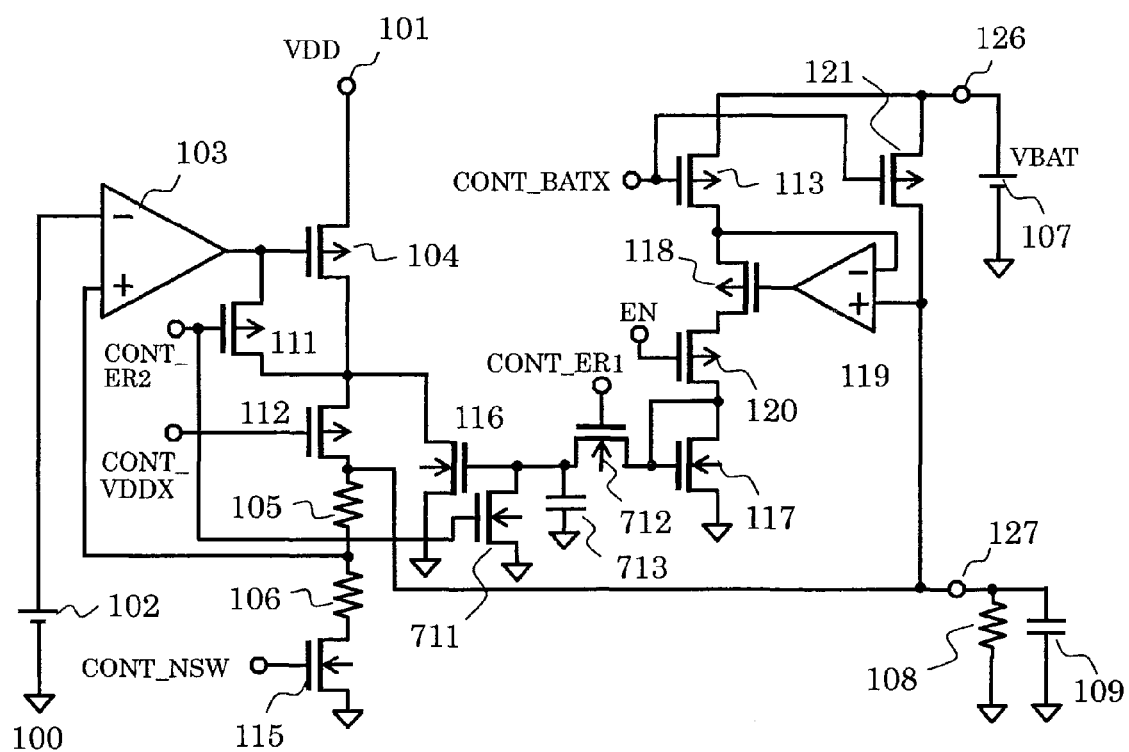
FIG. 7 is a circuit diagram illustrating a power supply switching circuit according to a third embodiment of the present invention.

FIG. 7 is a circuit diagram of a power supply switching circuit according to a third embodiment of the present invention. The difference from FIG. 1 resides in that the PMOS transistor 114 is deleted, NMOS transistors 711 and 712 and a capacitor 713 are added, and the connection of the PMOS transistor 111 is changed.

Next, a description is given of connections in the power supply switching circuit according to the third embodiment. The NMOS transistor 711 has a gate connected to the terminal CONT_ER2, a drain connected to the gate of the NMOS transistor 116, and a source connected to the ground terminal 100. The NMOS transistor 712 has a gate connected to the terminal CONT_ER1, a source connected to the gate of the NMOS transistor 116, and a drain connected to the gate and the drain of the NMOS transistor 117. The capacitor 713 has one terminal connected to the gate of the NMOS transistor 116 and the other terminal connected to the ground terminal 100. The PMOS transistor 111 has a gate connected to the terminal CONT_ER2, a drain connected to the drain of the PMOS transistor 104, and a source connected to the output of the error amplifier circuit 103 and the gate of the PMOS transistor 104. The other connections are the same as those in the power supply switching circuit according to the first embodiment of FIG. 1.

Figure 8:
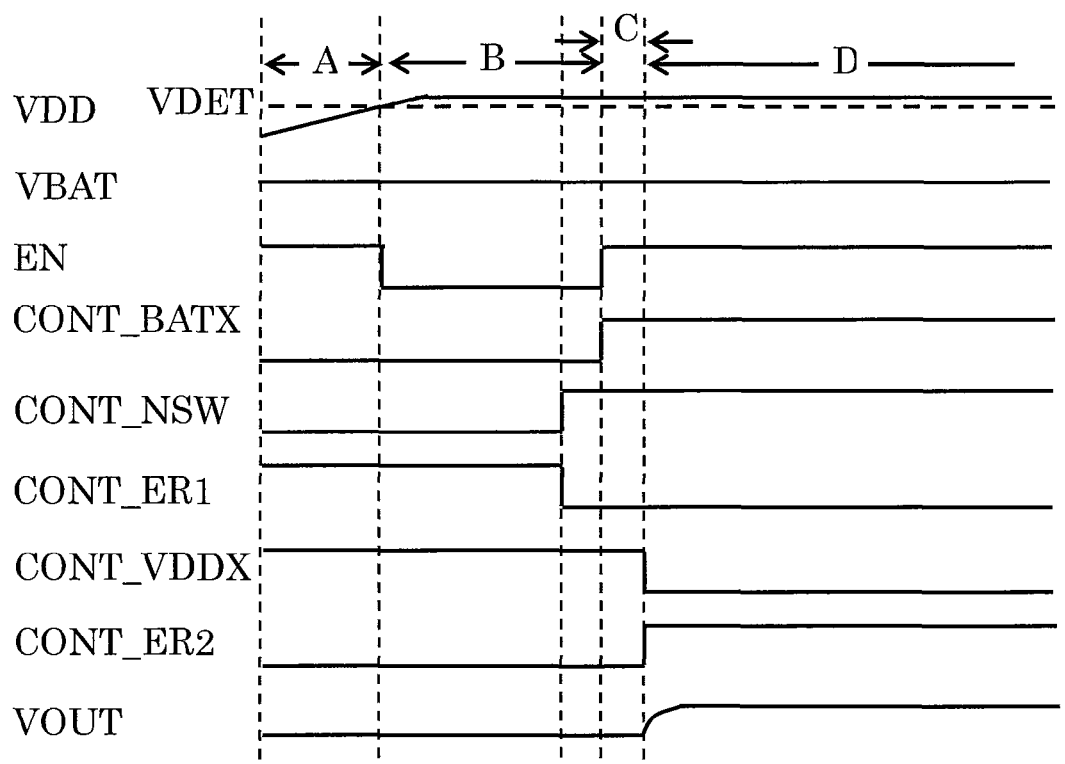
FIG. 8 is a timing chart according to the third embodiment.
Figure 9:
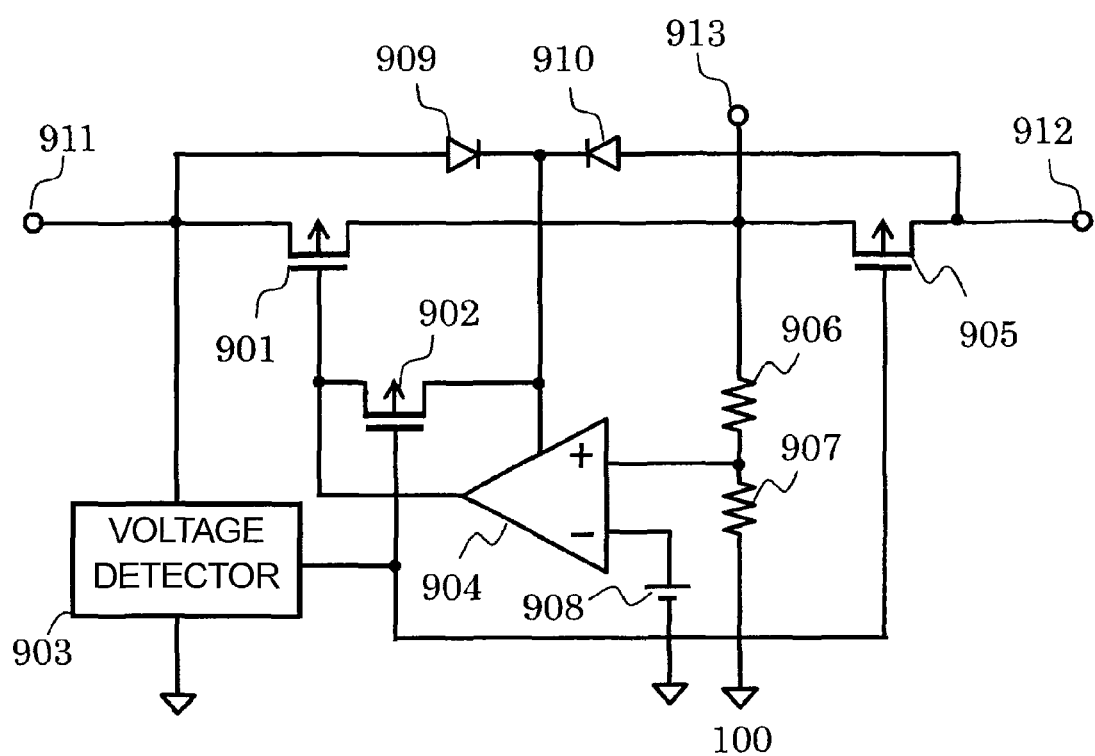
FIG. 9 is a circuit diagram illustrating a conventional voltage regulator.

Next, a description is given of the operation of the power supply switching circuit according to the third embodiment. FIG. 8 is a timing chart of the power supply switching circuit according to the third embodiment.

In a period A, the power source is connected to the first power supply terminal 101, and a voltage VDD rises. A voltage signal of Low is input to the terminal CONT_BATX. The PMOS transistors 113 and 121 are turned ON but operate in a resistance region. Thus, a voltage VOUT of the output terminal 127 becomes a voltage decreased from a voltage VBAT of the battery 107 by a voltage drop corresponding to a load current and an ON-state resistance of the PMOS transistor 121.

In a period B, when the voltage VDD rises to exceed a voltage VDET, a voltage signal of Low is input to the terminal EN, and hence the PMOS transistor 120 and the bias circuits 203 and 204 are turned ON to operate the amplifier 119. The PMOS transistor 121 operates in the resistance region, and hence the drain of the PMOS transistor 121 exhibits a voltage drop corresponding to the amount of the current from the battery 107. The PMOS transistor 113 has the same configuration having the same or smaller size than that of the PMOS transistor 121, and operates in the resistance region similarly to the PMOS transistor 121. The amplifier 119 controls the PMOS transistor 118 so that the voltage of the non-inverting input terminal and the voltage of the inverting input terminal may be equal to each other, and causes a current proportional to the size of the PMOS transistor 121 to flow through the PMOS transistor 113. The current flowing through the PMOS transistor 113 is referred to as "replica current", which is a current proportional to the current supplied by the battery 107 to the load resistor 108 via the output terminal 127.

Because a voltage signal of High is input to the terminal CONT_ER1, the NMOS transistor 712 is turned ON so that the gate and the drain of the NMOS transistor 117 are connected to the capacitor 713 to form a current mirror. In this way, a voltage for causing the replica current to flow through the NMOS transistor 116 is held in the capacitor 713, and the replica current is mirrored to the NMOS transistor 116. Further, because a voltage signal of Low is input to the terminal CONT_ER2, the PMOS transistor 111 is turned ON so that the gate and the drain of the PMOS transistor 104 are diode-connected. In this state, the replica current is caused to flow through the PMOS transistor 104. Further, a voltage for causing the replica current to flow is held at the gate of the PMOS transistor 104.

Next, a voltage signal of High is input to the terminal CONT_NSW and a voltage signal of Low is input to the terminal CONT_ER1, and hence the NMOS transistor 115 is turned ON and the NMOS transistor 712 is turned OFF. In this way, a voltage obtained by dividing the voltage of the output terminal 127 by the resistors 105 and 106 is input to the non-inverting input terminal of the error amplifier circuit 103. Because the NMOS transistor 712 is turned OFF, the current mirror circuit cannot be formed to mirror the replica current. However, the replica current of the NMOS transistor 116 is maintained by the capacitor 713, and hence the replica current can be caused to flow through the PMOS transistor 104 for a while.

In a period C, a voltage signal of High is input to the terminal EN and the terminal CONT_BATX, and hence the PMOS transistors 113, 121, and 120 and the amplifier 119 are turned OFF. In this way, the supply of the current from the battery 107 to the output terminal 127 is interrupted.

In a period D, a voltage signal of Low is input to the terminal CONT_VDDX and a voltage signal of High is input to the terminal CONT_ER2, and hence the PMOS transistor 112 and the NMOS transistor 711 are turned ON and the PMOS transistor 111 is turned OFF. In this way, the voltage regulator is activated so that the output voltage of the voltage regulator is output to the output terminal 127. Because the PMOS transistor 121 serving as the current path from the battery 107 to the output terminal 127 has been turned OFF in the period C, the back flow of the output voltage of the voltage regulator to the battery 107 can be prevented. Further, because the voltage of the output terminal 127 is held by the load capacitor 109 for a while, the drop of the output voltage can be prevented by reducing the length of the period C. Because the voltage for causing the replica current to flow is held at the gate of the PMOS transistor 104, such an operation as to abruptly fluctuate a load current at the output of the voltage regulator can be stopped. Further, if the output voltage of the voltage regulator is larger than the battery voltage VBAT, the voltage of the inverting input terminal of the error amplifier circuit 103 is larger than the voltage of the non-inverting input terminal in the period C, and hence the occurrence of undershoot can be suppressed at the time of switching.

Note that, the amplifier 119 described above is the amplifier having the configuration illustrated in FIG. 2, but any other configuration such as a general amplifier as illustrated in FIG. 3 may be used as long as a bias current can be turned on and off by the signal of the terminal EN.

As described above, in the power supply switching circuit according to the third embodiment, by causing the replica current to flow through the PMOS transistor 104 in advance before the voltage of the output terminal 127 is switched, the gate voltage for causing the replica current to flow is held at the gate of the PMOS transistor 104. Then, such an operation as to fluctuate a load current at the output of the voltage regulator can be stopped at the time of switching the output voltage, and hence the occurrence of undershoot at the output terminal 127 can be prevented.

What is claimed is:

1. A power supply switching circuit, comprising:
   a voltage regulator that operates with a voltage of a first power supply terminal, the voltage regulator comprising a reference voltage circuit, an error amplifier circuit, an output transistor, and a voltage divider circuit;
   a replica current generation circuit for generating a replica current that is proportional to a current flowing from a second power supply terminal to an output terminal; and
   a current mirror circuit for causing the replica current to flow through the output transistor of the voltage regulator,
   wherein, when a voltage of the output terminal is switched from a voltage of the second power supply terminal to a voltage of the voltage regulator, the replica current is caused to flow in advance through the output transistor of the voltage regulator before the switching.

2. A power supply switching circuit according to claim 1, wherein the replica current generation circuit comprises:
   a first transistor provided between the second power supply terminal and the output terminal;
   a second transistor including a gate and a source that are connected in common to a gate and a source of the first transistor, respectively;
   a third transistor including a source connected to a drain of the second transistor; and
   an amplifier including a non-inverting input terminal connected to a drain of the first transistor and the output terminal, an inverting input terminal connected to the source of the third transistor, and an output terminal connected to a gate of the third transistor.

3. A power supply switching circuit according to claim 2, wherein:
   the voltage regulator further comprises a fourth transistor connected between a gate and a drain of the output transistor; and
   the fourth transistor is turned ON when the replica current is caused to flow through the output transistor.

4. A power supply switching circuit according to claim 3, wherein the current mirror circuit comprises:
   a fifth transistor including a gate and a drain connected to each other;
   a sixth transistor including a gate connected to the gate of the fifth transistor, and a drain connected to a drain of the output transistor of the voltage regulator; and
   a capacitor connected to the gate of the sixth transistor.

* * * * *